United States Patent
Wu et al.

(10) Patent No.: US 8,627,179 B1
(45) Date of Patent: Jan. 7, 2014

(54) SPLIT SECTOR RECOVERY METHOD

(71) Applicant: Marvell International Ltd., Hamilton (BM)

(72) Inventors: Zining Wu, Los Altos, CA (US); Gregory Burd, San Jose, CA (US); Nitin Nangare, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/685,207

(22) Filed: Nov. 26, 2012

Related U.S. Application Data (63) Continuation of application No. 13/410,068, filed on Mar. 1, 2012, now Pat. No. 8,321,763, which is a continuation of application No. 12/263,235, filed on Oct. 31, 2008, now Pat. No. 8,136,016.

(60) Provisional application No. 60/986,366, filed on Nov. 8, 2007.

(51) Int. Cl.
*H03M 13/00* (2006.01)

(52) U.S. Cl.
USPC .......................................... 714/769

(58) Field of Classification Search
USPC ......... 714/758–766, 768–776, 779, 781, 786, 714/798–801, 805
See application file for complete search history.

(56) References Cited

U.S. PATENT DOCUMENTS

| | | | |
|---|---|---|---|
| 5,818,806 A * | 10/1998 | Wong et al. ................. | 369/53.33 |
| 6,690,524 B1 | 2/2004 | Wakefield et al. | |
| 6,826,140 B2 * | 11/2004 | Brommer et al. ............... | 369/94 |
| 6,982,939 B2 * | 1/2006 | Powelson et al. .......... | 369/47.53 |
| 7,020,833 B2 | 3/2006 | Watanabe et al. | |
| 7,512,040 B2 * | 3/2009 | Yoshida et al. ............ | 369/30.23 |
| 2002/0126604 A1 * | 9/2002 | Powelson et al. .......... | 369/47.53 |
| 2003/0161422 A1 * | 8/2003 | Bi .................................. | 375/348 |
| 2004/0205395 A1 * | 10/2004 | Kojima ........................... | 714/21 |
| 2007/0113161 A1 * | 5/2007 | Lingam et al. ................ | 714/796 |
| 2007/0273995 A1 | 11/2007 | Unoki et al. | |

OTHER PUBLICATIONS

U.S. Appl. No. 12/263,235, filed Oct. 31, 2008, Zining Wu et al., "Split Sector Recovery Method".

* cited by examiner

*Primary Examiner* — Nadeem Iqbal (57) ABSTRACT

Reproduction of encoded data which includes a split-mark. FIR data corresponding to split-mark and FIR data affected by the split-mark due to inter-symbol-interference are identified. FIR data corresponding to the split-mark is removed from the received FIR data. Recovered data is created by removing incorrect inter-symbol-interference from the FIR data due to the split-mark, and adding correct inter-symbol-interference from codeword bits. The recovered data is stitched together with data unaffected by split-mark data.

20 Claims, 10 Drawing Sheets

SPLIT SECTOR RECOVERY METHOD

CROSS-REFERENCE TO RELATED APPLICATION

The present disclosure is a continuation of and claims priority to U.S. patent application Ser. No. 13/410,068, filed Mar. 1, 2012, now U.S. Pat. No. 8,321,763, issued Nov. 27, 2012, which is a continuation of U.S. patent application Ser. No. 12/263,235, filed Oct. 31, 2008, now U.S. Pat. No. 8,136,016, issued Mar. 13, 2012, which claims the benefit of U.S. Provisional Patent Application No. 60/986,366, filed Nov. 8, 2007, which are incorporated herein by reference.

TECHNICAL FIELD

The present disclosure generally relates to reading data from a hard disk which includes a split sector.

BACKGROUND

Storing and retrieving data on a hard disk or other storage media are essential to modern computing. Ordinarily, data is stored in a hard disk in concentric circles called tracks. The disk is generally further formatted with the SERVO wedges. In today's drives there are generally about 200 SERVO wedges. Portions of the tracks corresponding to servo wedges contain some system information and user data is generally written elsewhere on the track.

User data is generally stored on the media in logical sector format, e.g. 512 bytes of user data plus some overhead for error correction code. Logical sectors are protected by Error Correction Code (ECC), e.g. Reed Solomon (RS) or Low-Density Parity Check Code (LDPC) to ensure high data reliability. ECC may protect an entire logical sector or logical sectors may be sub-divided into multiple ECC code words.

Sometimes it is not possible to fit an integral number of logical sectors between two consecutive SERVO wedges. In this case, a logical sector is broken into two physical sectors. A first physical sector is written before the SERVO wedge and a second physical sector is written after the SERVO wedge. This is commonly referred to as a split sector. In the absence of a split sector, a logical sector coincides with a physical sector. Each physical sector generally has the following format on the media: (preamble (a sequence of 00110011 . . . ), sync mark 1, user data +ECC, postamble (11001100 . . . )). Alternatively, it is also possible to have two sync marks per physical sector: (preamble, sync1, data1, sync2, data2, postamble). Here the second syncmark splits the user payload into two parts: data1 and data2.

Split sectors, and second syncmark causes fragmentation of user data on media in that user data that belongs to the same logical sector does not correspond to a continuous segment on the media. Instead some other bits (e.g. corresponding to the $2^{nd}$ syncmark) are placed in-between user bits. During the readback process, the decoder has to remove any system information that was inserted in-between the data (e.g. sync2) and format the data into logical sectors before starting an ECC decoding process and/or returning data back to a Host.

SUMMARY

The present disclosure addresses the foregoing issues by providing a formatter block that can stitch FIR samples together into a single continuous stream, thereby removing the necessity for an iterative decoder to have any knowledge of data format on the media. Multiple implementations of a formatting operation are discussed herein. In particular a formatting operation that largely removes any discontinuity in an FIR data stream that might result in stitching FIR samples corresponding to not-contiguous bits streams on the media is disclosed.

This brief summary has been provided so that the nature of the disclosure may be understood quickly. A more complete understanding can be obtained by reference to the following detailed description in connection with the attached drawings.

DETAILED DESCRIPTION

A process of recording data onto a disk and common causes of split-mark data will be described with respect to FIGS. 1 to 3.

Generally, to store data on a hard disk, the data is partitioned into logical sectors, encoded by Error Correction Code (ECC), and then written onto the magnetic media.

In accordance with various embodiments of the present invention, in the absence of a split sector and a second syncmark, the entire logical sector is written to a portion of the track without any system data being inserted in between. For such sectors, ideal FIR data is just convolution of codeword bits with the target response h(k) as shown in the following equation, Eq. (1):

$$y'_i = \sum_{k=0}^{M} h_k \cdot c_{i-k} \quad (1)$$

where $y'_i$ is ideal FIR data, $c_k$ are codeword bits, $h_k$ is target channel response of form $\underline{h}=[h_0\ h_1\ \ldots\ h_M]$, and M is the memory length of channel response.

On the other hand if the amount of media between sector start and next SERVO wedge is not enough to hold the entire logical sector, then the logical sector may be split into two (or more) physical sectors. Sometimes it is not possible to fit an integral number of logical sectors between two consecutive SERVO wedges. In this case, a logical sector is broken into two physical sectors. A first physical sector is written before the SERVO wedge and a second physical sector is written after the SERVO wedge (For example, see FIG. 1A). This is commonly referred to as a split sector. In the absence of a split sector, a logical sector coincides with a physical sector. Each physical sector generally has the following format on the media: (preamble (a sequence of 00110011 . . . ), sync mark 1, user data +ECC, postamble (11001100 . . . )). Alternatively, it is also possible to have two sync marks per physical sector: (preamble, sync1, data1, sync2, data2, postamble). Here the second syncmark splits the user payload into two parts: data1 and data2.

Figure 1A:
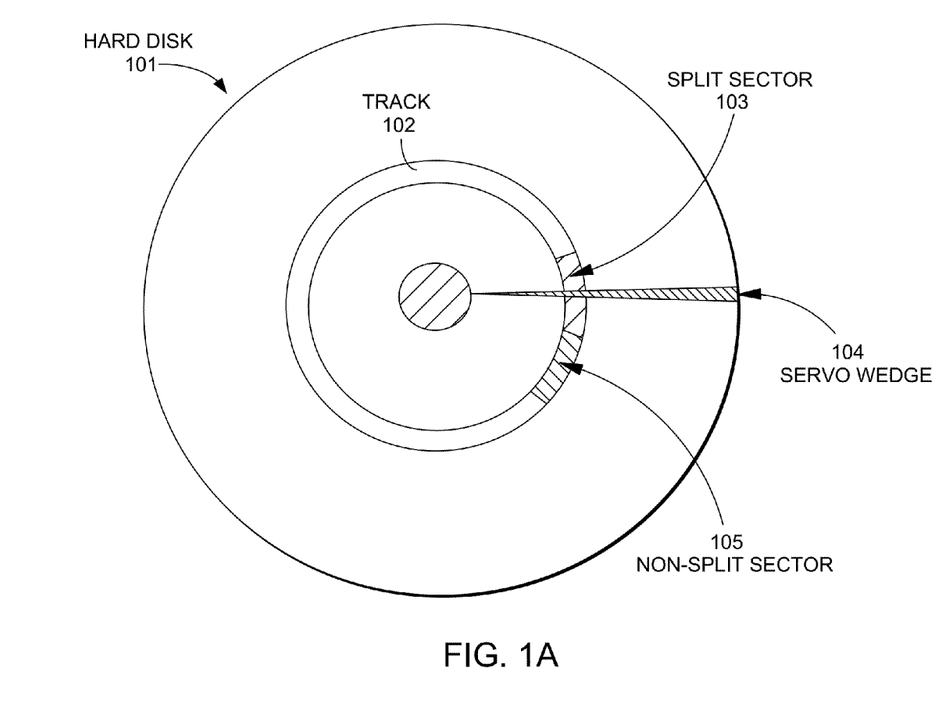
FIG. 1A is a representation of a hard disk including a split sector caused by a servo wedge.

As can be seen from FIG. 1A, a split sector 103 has been introduced into the data on hard disk 101. This split sector is caused by a servo wedge 104 intersecting encoded data on that sector. A servo wedge bisects a track 102 causing the split sector 103. In contrast, non-split sector 105 consists of continuous data. A similar case occurs if a dual sync mark is used. The second sync mark fragments the ECC codeword into two parts.

As indicated above, a servo wedge is added to the recorded data purposely by the system. For example, the servo wedge can contain a unique magnetic pattern that provides a reference to the center of the track, so that the hard drive can quickly and accurately locate data on the disk.

Figure 1B:
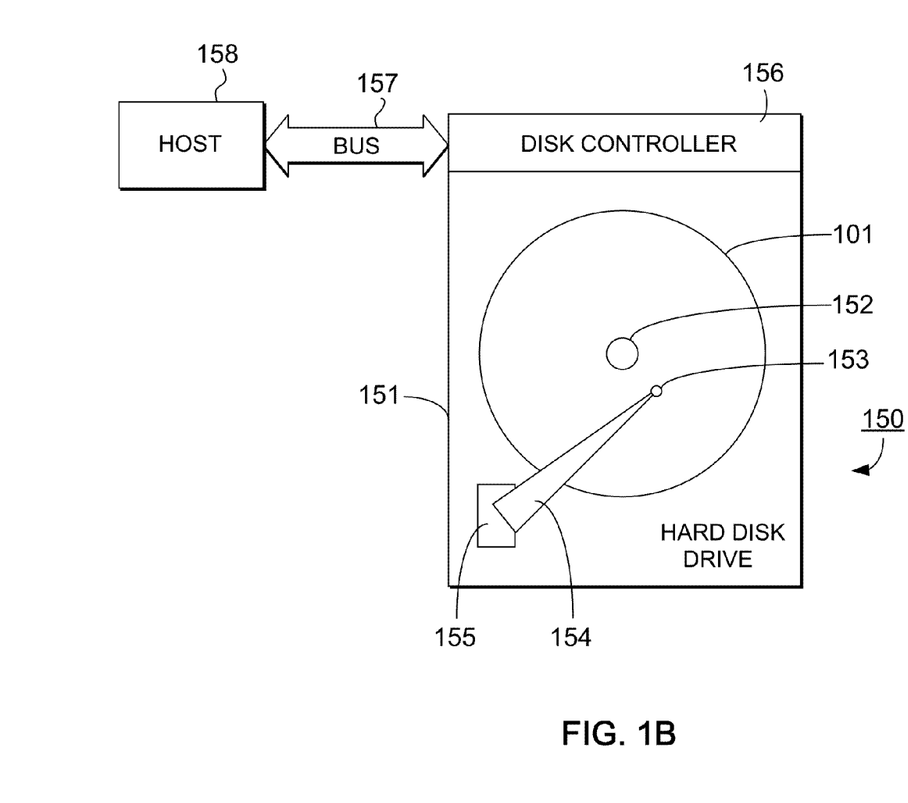
FIG. 1B is a representational view of a hard disk drive according to an example embodiment.

FIG. 1B is a representational view of a hard disk drive according to an example embodiment. Mechanically, hard disk drive 150 includes housing 151 which houses hard disk 101. In one implementation, hard disk 101 is a platter coated with a magnetic material and rotatable about spindle 152 by a drive motor (not shown). A read/write head 153 is mounted to arm 154 for movement of the read/write head across the surface of hard disk 101 under control of actuator 155.

Hard disk drive 150 further includes disk controller 156 which generally includes a processor such as a digital signal processor, a microprocessor, a microcontroller or the like, for execution of instructions stored in memory for electrical and mechanical control of the hard disk drive components, and for electrical and mechanical control of hard disk drive circuitry. Disk controller 156 includes an interface via bus 157 to a host 158. Host 158 might be a personal computer such as a laptop or desktop, or host 158 can be an embedded device such as a hand-held PDA or music player. Other examples of host 158 are given in connection with FIGS. 10A through 10H, below.

Bus 157 can be an EIDE interface, an ATA or serial ATA (SATA) interface, a fiber channel (FC), or a serial attached SCSI (SAS) interface, although it will be understood that other buses and other interfaces might be used.

Figure 2:
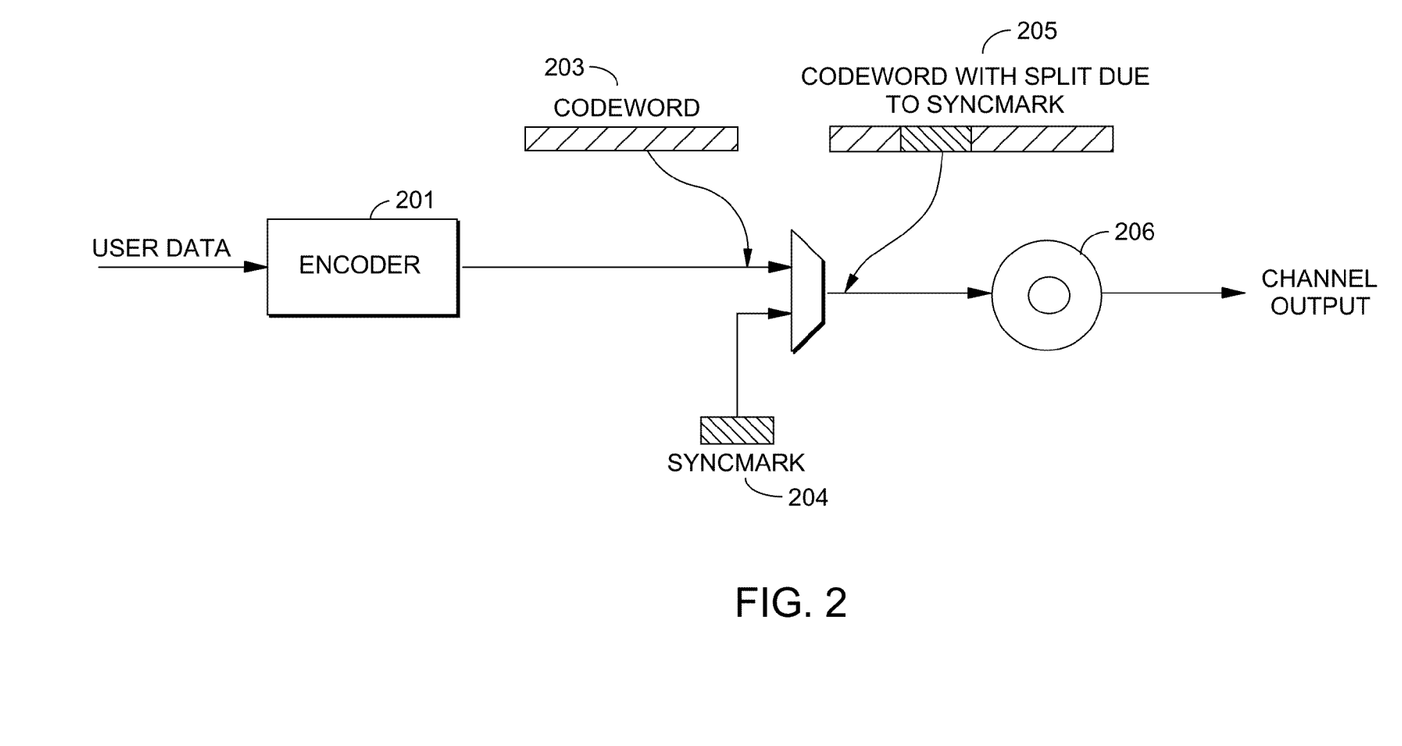
FIG. 2 is a block diagram illustrating an encoding process in which a syncmark is introduced into a codeword.

FIG. 2 is a block diagram illustrating an encoding process that includes introduction of a second syncmark 204 into a codeword 205, causing a split within the codeword 205.

As mentioned above, when user data is stored on a hard disk 206, it is first encoded into binary data, a process represented by encoder 201 A codeword of length N may be represented as:

$c_1 c_2 c_3 c_4 \ldots c_{N-3} c_{N-2} c_{N-1} c_N$ where $(c_1 \ldots c_N)$ represent the encoded and interleaved data bits.

However, a second syncmark 204 may be added to the data. For example, the syncmark may be added to aid data synchronization. Thus, the codeword 205 on the hard disk 206 now contains a 'split' due to the addition of the syncmark data. The written data stream may be represented as:

$c_1 c_2 c_3 \ldots c_L a_1 a_2 a_3 \ldots a_{s-2} a_{s-1} a_s c_{L+1} \ldots c_{N-1} c_N$ where $(a_1 \ldots a_s)$ represent the split-mark data bits.

As a result of the servo wedge in FIG. 1B or the second syncmark insertion in FIG. 2, FIR samples corresponding to a physical sector do not form a continuous stream, and instead contain some samples corresponding to system bits (e.g. second sync, preamble or postamble). Thus, when the data is read from the disk, the system needs a way to discard the split-mark data and the accompanying inter-signal interference (ISI) affecting the data following the split.

One method for removing this discontinuity is referred to as "simple stitching", in which the FIR data before and after the split are simply connected together in the reproduction process. However, simple stitching does not adequately account for the incorrect ISI in the signal due to the split.

Figure 3A:
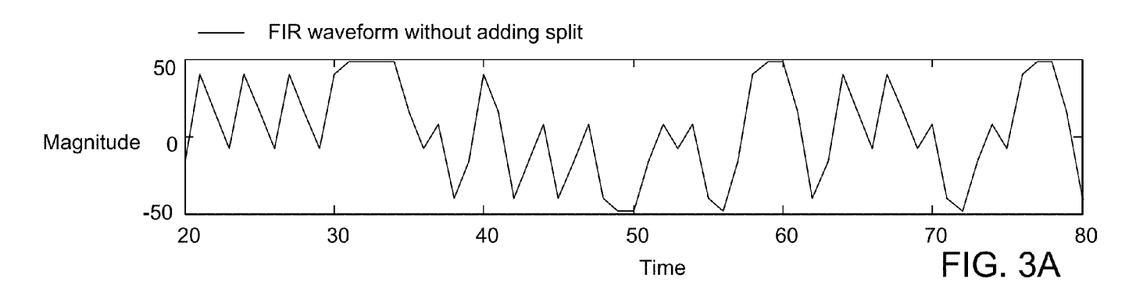
FIG. 3A illustrates an analog waveform without a split sector.
Figures 3B, 3C:
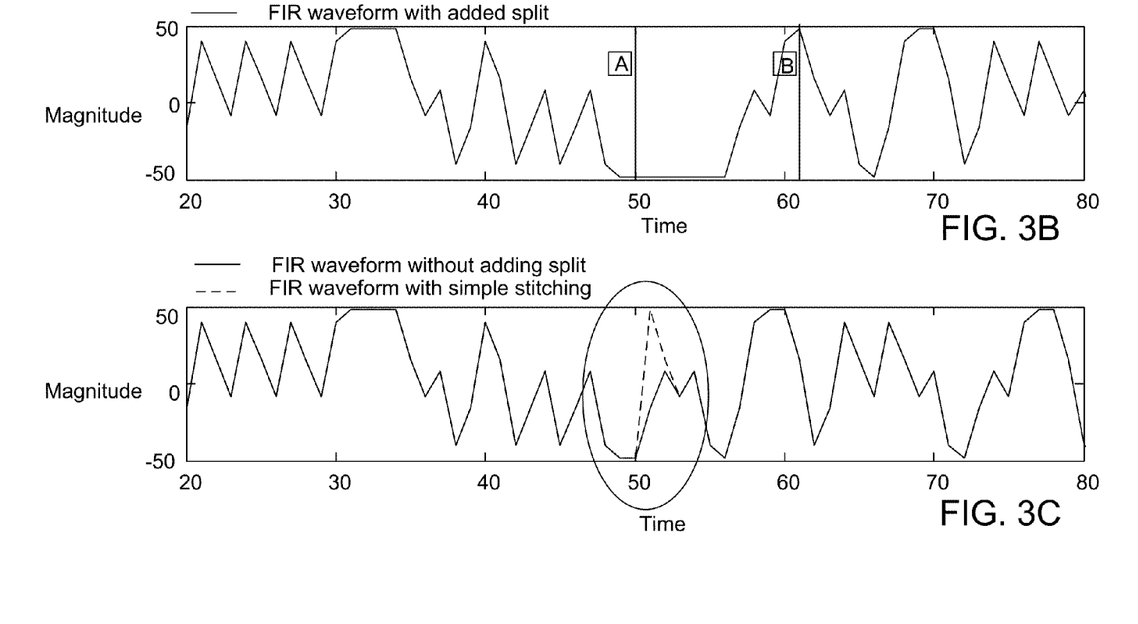
FIG. 3B illustrates an analog waveform with a split sector added.
FIG. 3C illustrates a comparison between the analog waveform without a split sector, and an analog waveform after simple stitching is conducted.

For example, FIG. 3A depicts an analog waveform of data without a split as it appears when read from a hard disk, and FIG. 3B depicts an analog waveform when read from a hard disk with an added split where [A] shows the beginning of the split data and [B] shows the end of the split data.

FIG. 3C shows an FIR waveform without a split and an FIR waveform that has had a split removed using simple stitching. These waveforms are shown as they appear after reading from the hard disk. As seen in FIG. 3C, the simply stitched waveform deviates significantly from the ideal waveform without a split.

Accordingly, a system and method for split sector recovery will now be described with respect to FIGS. 4A, 4B and 5.

Figure 4A:
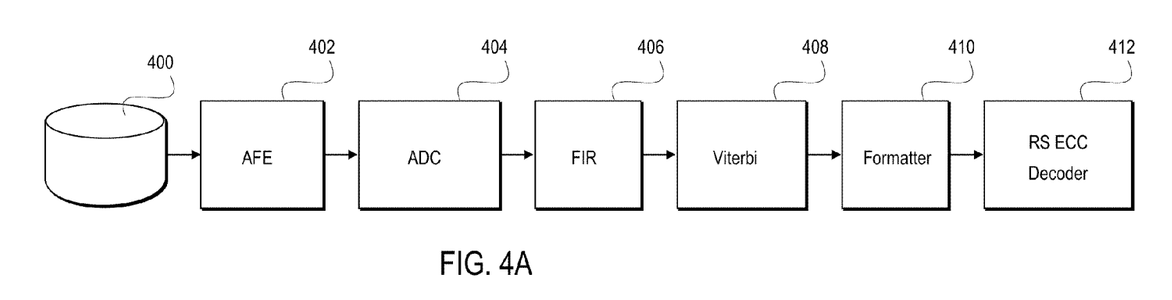
FIGS. 4A and 4B are block diagrams of a system for split-sector recovery.
Figure 4B:
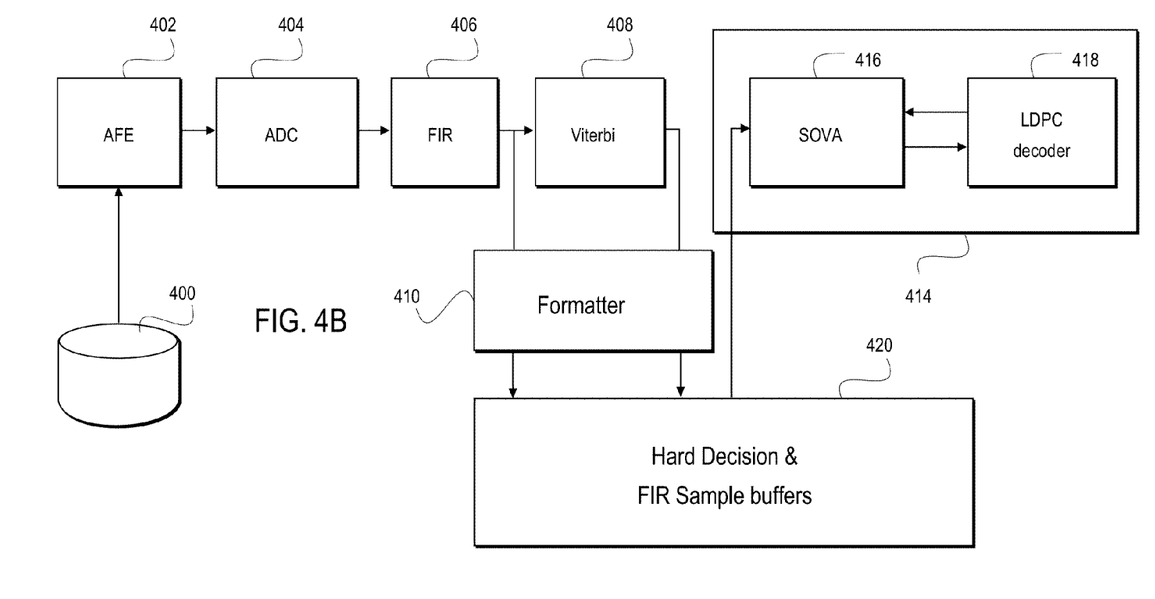

FIGS. 4A and 4B schematically depict data reproduction systems in which split sector recovery may be practiced. This system may be embodied in any number of devices for reproducing data, including a hard disk controller, a hard disk drive, a CD-ROM drive, and a DVD-RW drive, among many others.

In general, a read-back waveform passes from the disk 400 to the analog from end (AFE) 402, sampled by the analog-to-digital converter (ADC) 404, and passed through a finite impulse response (FIR) filter 406. Output of the FIR filter 406 is referred to as FIR data henceforth. FIR data of every recorded bit generally contains interference from adjacent recorded bits, commonly known as inter-symbol-interference (ISI). FIR samples are fed to a Viterbi detector 408 that produces hard decisions. Due to channel noise, the bit stream at the output of the Viterbi detector 408 might contain errors. The Viterbi output is then given to an ECC decoder 412, after passing through formatter 410, to correct any residual errors before outputting the data to the Host.

If the decoder 412 utilizes hard decision decoding (e.g. RS ECC decoder), then the Read Formatter 410 simply has to remove the bits corresponding to the second syncmark prior to using the RS ECC decoder 412. Similarly for the case of split sector, the formatter 410 has to concatenate several data streams that come at different times in order to form a received ECC codeword. A corresponding configuration for LDPC code is shown in FIG. 4B. If the decoder 412 is an iterative decoder, i.e. the decoder consists of a channel detector 416 (e.g. BCJR/SOVA) and a LDPC code decoder 418 (e.g. Sum-Product (SP), or Min-Sum (MS) decoder), then such a decoder takes FIR samples as the input. It then proceeds to iterate between the channel and the code decoder until some predetermined number of iterations have been performed, or no parity violations have been detected. FIG. 4B illustrates an exemplary block diagram of a data path with an iterative decoder 414. Unlike a hard RS ECC decoder that takes Viterbi hard-decisions as input, an iterative decoder takes FIR samples as the input from the FIR Sample Buffers 420. Consequently, in the presence of an iterative decoder, the formatter 410 has to group together FIR samples corresponding to an entire iterative codeword (i.e. remove samples corresponding to second sync, and or any data added to accommodate split sector.

Note that forming a continuous stream of FIR samples corresponding to an iterative codeword is not necessary. Alternatively, it is possible to run the channel detector on FIR samples that include the second sync mark, obtain Log-Likelihood Ratios (LLR's) and then have a formatter inside the iterative decoder to remove LLR's corresponding to, for example, the second sync mark prior to sending them to the code decoder. However, such an architecture would be very difficult to implement and would require extra storage for FIR samples corresponding to split-mark data. Furthermore, having to process extra samples (ones corresponding to second sync or split-mark data) would unnecessarily eat up available time, and therefore result in a reduction of the number of iterations that can be performed by the iterative decoder. Consequently, it is desirable to format FIR samples prior to sending them to the iterative decoder 414. In this embodiment the iterative decoder 414 does not have to be aware of the physical sector format, it only needs to deal with the iterative codeword.

Following FIR filter, the following relationship holds between FIR samples, and the data that is written onto the media:

$$y_i = \sum_{k=0}^{M} h_k \cdot c_{i-k} + noise_i$$

where $y_i$, $c_i$ represents the FIR sample and data bit at time i. Note that the FIR sample at time is a function of data bits at times i-M to i. As a result, splicing together FIR samples is not as easy as splicing hard decisions. In particular, if one simply stitches FIR samples for data 1 and data 2 portions, i.e. remove the second sync, then the above formula would not necessarily hold around the splicing point. This creates a so-called discontinuity in the FIR data stream and can later result in a degraded iterative decoder error rate. Note that the discontinuity does not happen if the last 4 bits of data 1 is matching the last 4 bits of the 2-nd sync. However this case happens with a probability of $(½)^M$, therefore most of the time we do get a discontinuity.

As discussed previously, there are two main reasons behind logical sector segmentation on the media—split sector and second sync mark. In the following description of the present invention, second sync mark will be used to illustrate various embodiments. However, it should be clear to those skilled in the art that the same techniques described herein also apply to the case of a split sector without any modifications.

The process for recovering data will now be described in more detail.

As described above with respect to FIG. 2, ideal FIR data may be given according to the equation $$y'_i = \sum_{k=0}^{M} h_k \cdot c_{i-k} \tag{1}$$

where $y'_i$ is FIR data, $c_k$ are codeword bits, $h_k$ is a magnetic channel target response of form $\underline{h}=[h_0\ h_1\ \ldots\ h]$, and M is the memory length of a magnetic channel.

As also discussed above, a codeword including a split may be represented by $c_1 c_2 c_3 \ldots c_L a_1 a_2 a_3 \ldots a_{s-2} a_{s-1} a_s c_{L+1} \ldots c_{N-1} c_N$ where $(c_1 \ldots c_N)$ represent the encoded and interleaved data bits and where $(a_1 \ldots a_s)$ represent the split-mark data bits.

When there is a split in the data introduced following data bit $c_L$, the FIR data for M bits after the split-mark end location, i.e. $y_{L+1} \ldots y_{L+M}$ may be calculated using the following equation, (Eq. 2), which takes the split-mark data into account:

$$y_{L+1} = h_0 \cdot c_{L+1} + \sum_{k=1}^{M} h_k \cdot a_{s-k+1} + n^y_{L+1} \tag{2}$$

$$y_{L+2} = h_0 \cdot c_{L+2} + h_1 \cdot c_{L+1} + \sum_{k=2}^{M} h_k \cdot a_{s-k+2} + n^y_{L+2}$$

$$\vdots$$

$$y_{L+M} = \sum_{k=0}^{M-1} h_k \cdot c_{L+M-k} + h_M \cdot a_s + n^y_{L+M}$$

where $n_i^y$ represents Additive White Gaussian Noise (AWGN) with mean=0 and variance=$\sigma^2$.

Bits $c_1 c_2 \ldots c_{L-1} c_L$ experience the same ISI as if a split-mark is not present, due to the causal nature of the ISI. However, bits $c_{L+1} c_{L+2} \ldots c_{L+M}$ experience ISI from codeword bits as well as from part of the split-mark bits. The split recovery method removes the ISI caused by the split-mark bits and recovers the sector as if the ISI were generated only by the codeword bits (similar to the ideal received data without a split-mark).

Due to the finite memory of a magnetic channel, only M received samples after the split-mark are affected by the split-mark. Thus, split sector recovery is performed for these M samples.

FIR data, when the split-mark is present in the channel data, may be expressed in the form:

$y_1 y_2 y_3 \ldots y_L x_1 x_2 x_3 \ldots x_{s-2} x_{s-1} x_s y_{L+1} \ldots y_M y_{M+1} \ldots y_{N-1} y_N$ where $(x_1 \ldots x_s)$ represents FIR data corresponding to split-mark data. At this time, the FIR data includes some data unaffected by split-mark data because it comes before the split $(y_1, y_2 \ldots y_L)$, some data corresponding to split-mark data $(x_1, x_2, \ldots x_s)$, some data that is affected by split-mark data through ISI $(y_{L+1}, \ldots y_{M-1}, y_M)$, and some data unaffected by split-mark data because it is beyond the limit of the channel memory $(y_{M+1}, \ldots y_{N-1}, y_N)$.

From Eq. (1) the ideal FIR data $y'_{L+1}$ can be derived:

$$y'_{L+1} = \underbrace{h_0 \cdot c_{L+1}}_{(1)} + \underbrace{\sum_{k=1}^{M} h_k \cdot c_{L+1-k}}_{(2)}$$

Moreover, the first FIR data corresponding to a split-mark can be written as Eq. (3):

$$x_1 = h_0 \cdot a_1 + \sum_{k=1}^{M} h_k \cdot c_{L+1-k} + n_1^x \Rightarrow \underbrace{\sum_{k=1}^{M} h_k \cdot c_{L+1-k}}_{(2)} + n_1^x = x_1 - h_0 \cdot a_1 \quad (3)$$

Using Eq. (2) from above, one can derive Eq. (4):

$$\underbrace{h_0 \cdot c_{L+1}}_{(1)} + n_{L+1}^y = y_{L+1} - \sum_{k=1}^{M} h_k \cdot a_{s-k+1} \quad (4)$$

Finally, adding Eq. (3) and Eq. (4) yields Eq. (5):

$$\underbrace{h_0 \cdot c_{L+1}}_{(1)} + \underbrace{\sum_{k=1}^{M} h_k \cdot c_{L+1-k}}_{(2)} + \underbrace{n_{L+1}^y + n_1^x}_{two-noise-terms} =$$

$$y_{L+1} - \sum_{k=1}^{M} h_k \cdot a_{s-k+1} + x_1 - h_0 \cdot a_1$$

The left-side of Eq. (5) is the same as an ideal received signal, $y'_{L+1}$, plus two noise terms. The right side of Eq. (5) has all known terms or received FIR data terms. Thus, ideal signal recovery for term $y_{L+1}$ is performed using Eq. (5).

In Eq. (5), the ISI contribution due to the split-mark has been removed from the FIR data $y_{L+1}$, and the ISI contribution due to the original codeword bits has been added to the FIR data $y_{L+1}$, such that it appears as if the split-mark were never present in the sector. In doing so, two noise terms are added to the sample, increasing the noise variance at the recovered sample positions. However, simulations show that the benefit of split sector recovery outweighs the increased noise variance.

In general, the M equations for doing split-sector-recovery may be written as:

$$y'_{L+i} + \underbrace{n_{L+i}^y + n_i^x}_{two-noise-terms} = y_{L+i} - \sum_{k=i}^{M} h_k \cdot a_{s-k+i} + x_i - \sum_{k=0}^{i-1} h_k \cdot a_{i-k}$$

for $1 \leq i \leq M$

Accordingly, using the equation shown above, split sector recovery is performed for sectors including split-mark data.

Figure 5:
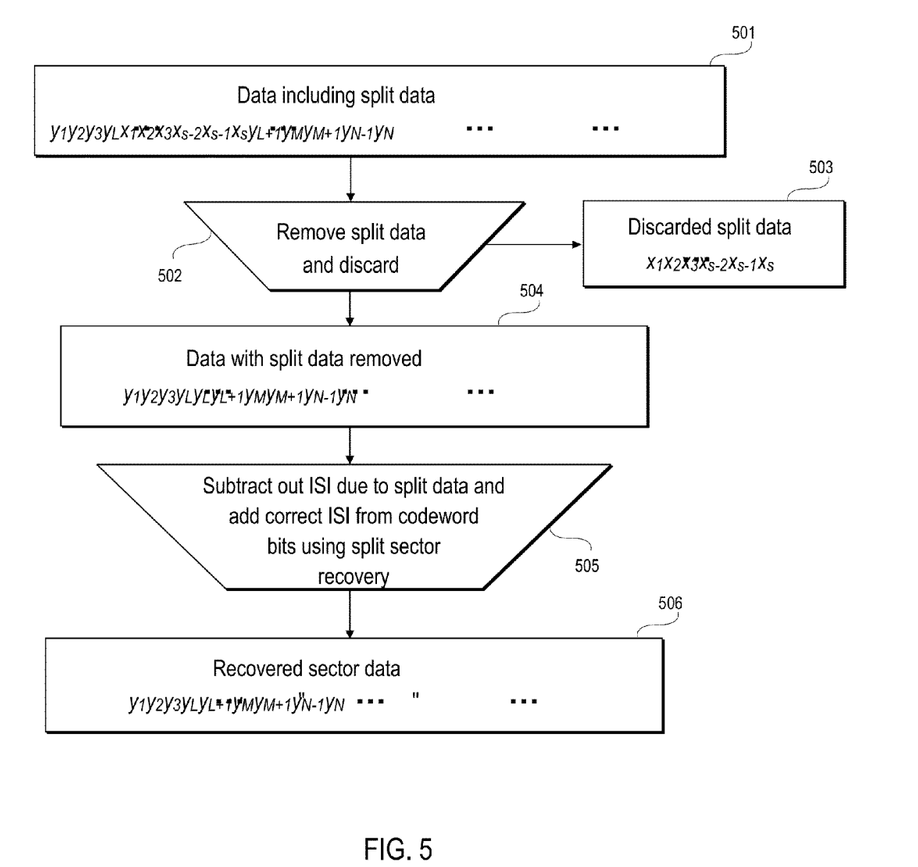
FIG. 5 is a flowchart illustrating a process of split-sector recovery.

FIG. 5 summarizes this process of split recovery.

Item 501 represents the sector FIR data including split-mark data, or
$y_1 y_2 y_3 \ldots y_L x_1 x_2 x_3 \ldots x_{s-2} x_{s-1} x_s y_{L+1} \ldots y_M y_{M+1} \ldots y_{N-1} y_N$.

The removal of the split-mark data is represented by item 502. More specifically, the split-mark data is removed by first removing FIR data corresponding to the split-mark, $x_1 x_2 x_3 \ldots x_{s-2} x_{s-1} x_s$, shown in item 503.

After removal of the split data, the FIR data with the split-mark removed remains, i.e., $y_1 y_2 y_3 \ldots y_L y_{L+1} \ldots y_M y_{M+1} \ldots y_{N-1} y_N$ shown in item 504, where $y_{L+1} \ldots y_M$ is FIR data that has been affected by the split data because of ISI.

The split sector recovery equation is performed in item 505:

$$y'_{L+i} + \underbrace{n_{L+i}^y + n_i^x}_{two-noise-terms} = y_{L+i} - \sum_{k=i}^{M} h_k \cdot a_{s-k+i} + x_i - \sum_{k=0}^{i-1} h_k \cdot a_{i-k}$$

for $1 \leq i \leq M$ to subtract out the ISI for M terms following the split-mark. This operation is specifically utilized by replacing $y_{L+i}$ with the right side of the equation for $1 \leq i \leq M$, so that $y_{L+1} \ldots y_M$ bits are now equal to the ideal received signal bits $y'_{L+1} \ldots y'_M$, from equation (1) plus the two added noise terms $$n_{L+i}^y + n_i^x.$$

Calling the FIR data $y''_{L+1} \ldots y''_M$, where $$y''_{L+i} = y'_{L+i} + \underbrace{n_{L+i}^y + n_i^x}_{two-noise-terms},$$

the recovered sector data is depicted in item 506 as
$y_1 y_2 y_3 \ldots y_L y''_{L+1} \ldots y''_M y_{M+1} \ldots y_{N-1} y_N$.

Figure 6:
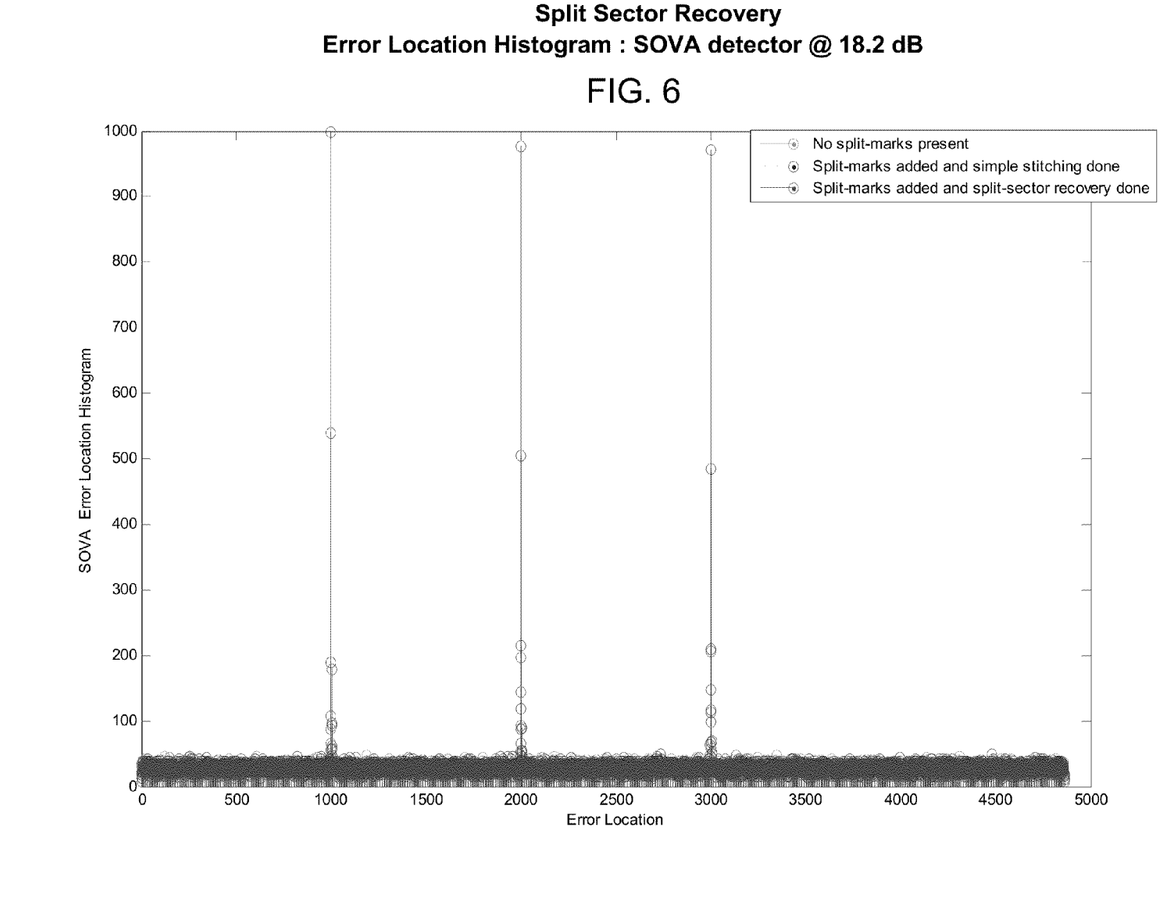
FIG. 6 is a histogram comparing error locations at a soft output Viterbi algorithm (SOVA) detector between data without a split sector, data with simple stitching, and data reproduced by the system for split-sector recovery.
Figure 7:
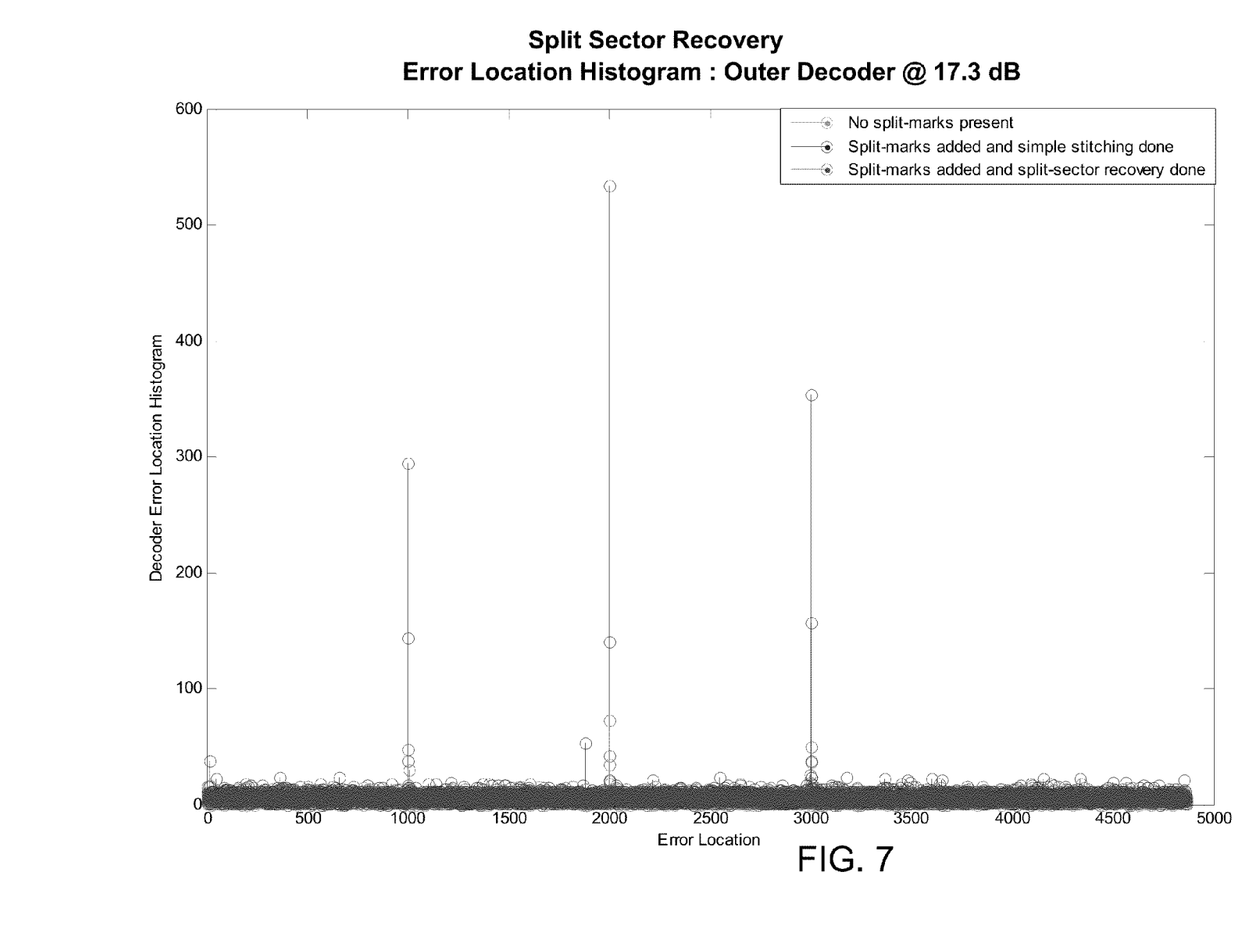
FIG. 7 is a histogram comparing error locations at an outer decoder between data without a split sector, data with simple stitching, and data reproduced by the system for split-sector recovery.

FIGS. 6 and 7 show error-location histograms at the SOVA output and outer decoder output, respectively, whereby 600-bit splits were added at the 1000, 2000, and 3000 bit positions of a codeword of length N>4100 bits. As can be seen in these figures, the split sector recovery method lowers the amount of error at both the SOVA output and outer decoder output.

Figure 8:
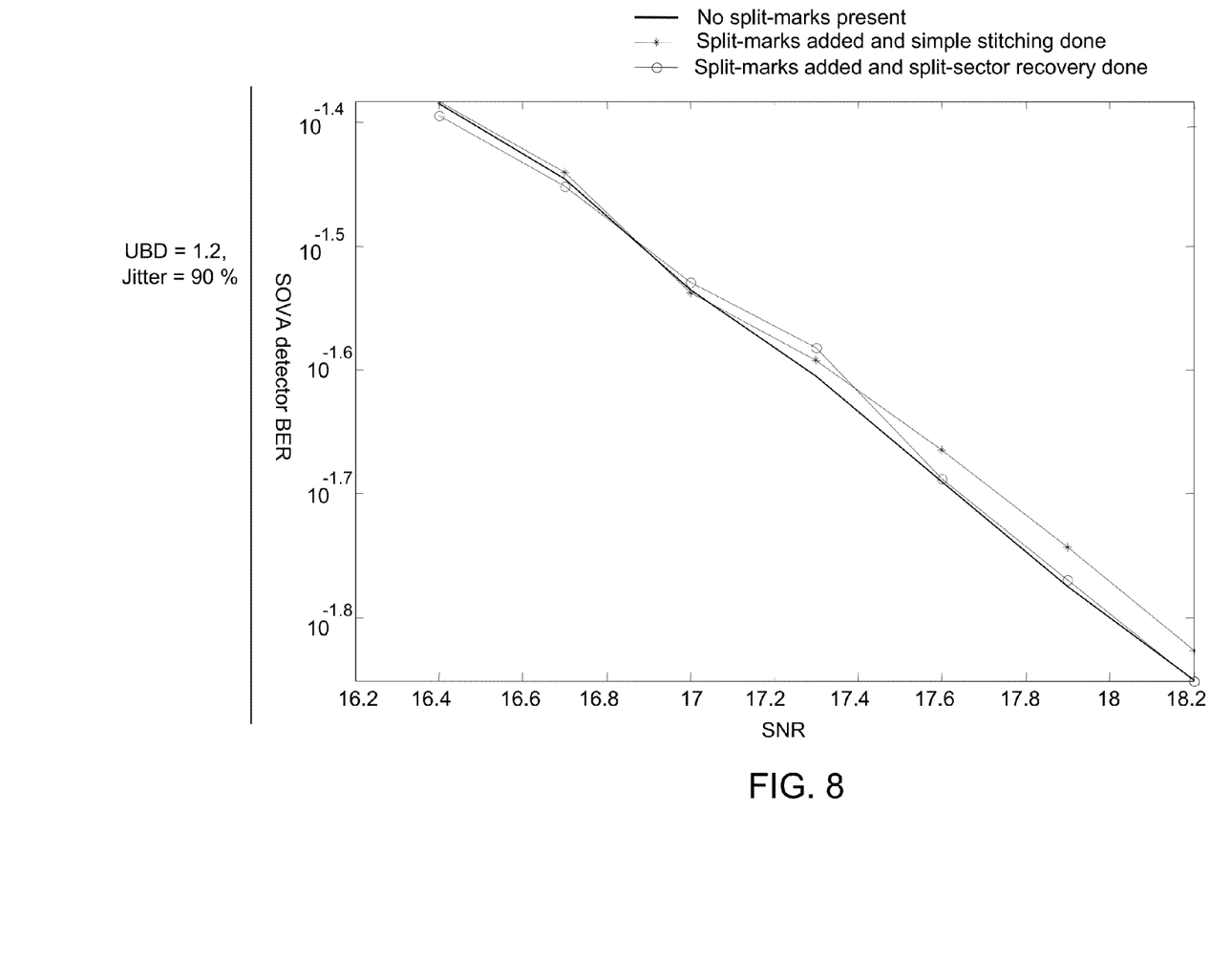
FIG. 8 is a chart of bit error rate (BER) against signal-to-noise ratio (SNR) at a SOVA detector between data without a split sector, data with simple stitching, and data reproduced by the system for split-sector recovery.
Figure 9:
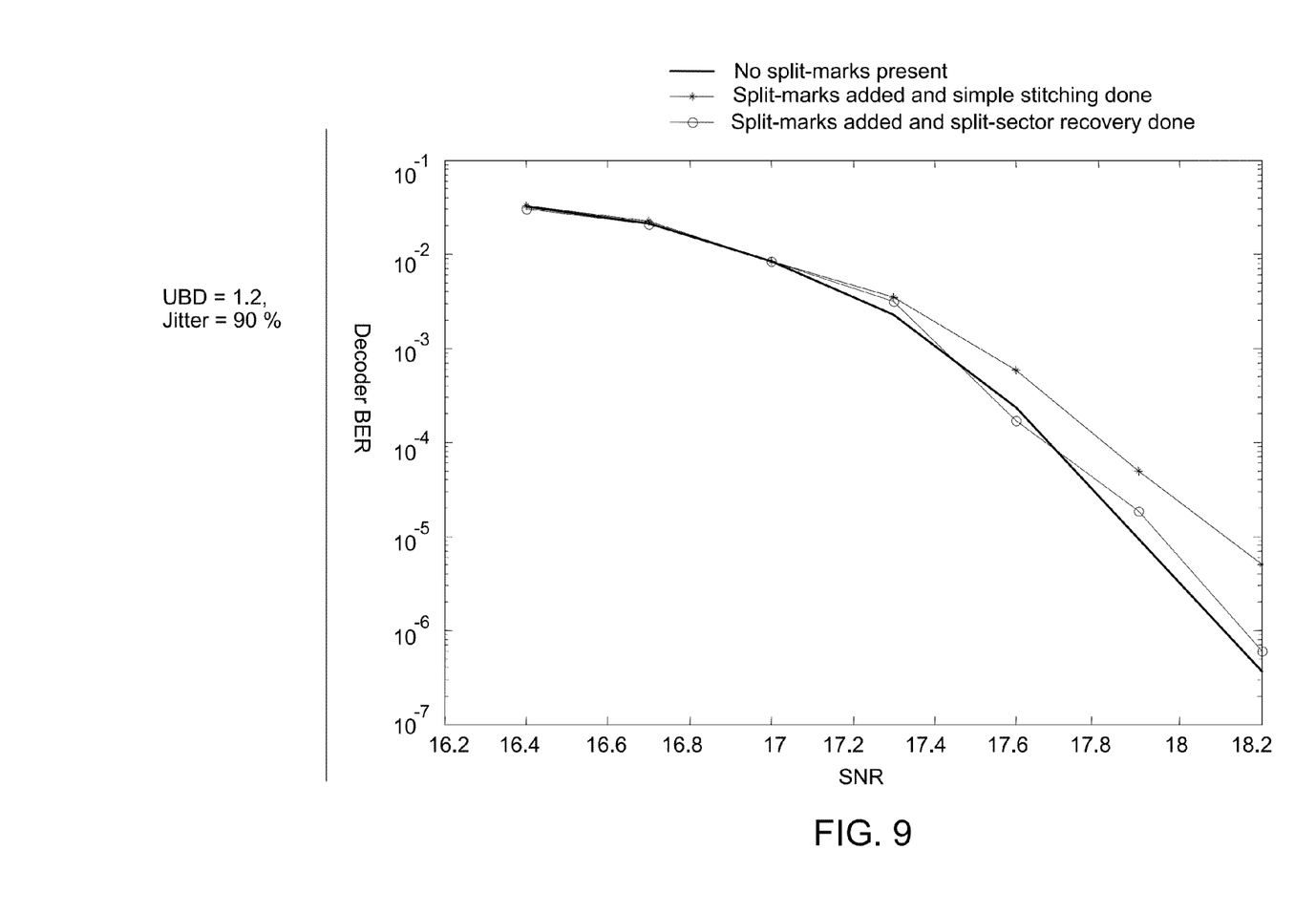
FIG. 9 is a chart of bit error rate (BER) against signal-to-noise ratio (SNR) at an outer decoder between data without a split sector, data with simple stitching, and data reproduced by the system for split-sector recovery.

FIGS. 8 and 9 display bit-error-rates at the output of the SOVA and outer decoder output, respectively. These figures show that the bit-error-rate for a codeword containing split data that is processed using the split sector recovery method will more closely approximate the bit-error-rate of a codeword with no split-marks present than will the bit-error-rate of a codeword containing split data that is simply stitched back together.

Thus, by virtue of the split sector recovery method, SNR loss is ordinarily reduced and bit-error rate is ordinarily improved. Moreover, since the system is not required to retain the data corresponding to the split-mark data, the amount of required memory can be reduced.

The present disclosure has been described above with respect to particular illustrative embodiments. It is understood that the disclosure is not limited to the above-described embodiments and that various changes and modifications may be made by those skilled in the relevant art without departing from the spirit and scope of this disclosure.

What is claimed is:
1. A disk drive controller comprising:
 a reading unit configured to read encoded data from a hard disk, wherein the encoded data comprises (i) a first segment of data, (ii) a second segment of data, and (iii) a third segment of data, wherein the first segment of data, the second segment of data and the third segment of data form consecutive segments of the encoded data, wherein the third segment of data comprises (i) a first subset of data and (ii) a second subset of data, wherein the first subset of data separates the second segment of data from the second subset of data, wherein the second segment of data is affected by a first contribution of inter-symbol interference due to the first segment of data, wherein the first subset of data is affected by a second contribution of inter-symbol interference due to the second segment of data, and wherein the second subset of data is unaffected by any contribution of inter-symbol interference due to the second segment of data;

an identification unit configured to identify, in the encoded data, (i) the first segment of data, (ii) the second segment of data, and (iii) the first subset of data from the third segment of data;

a recovery unit configured to (i) remove the second segment of data from the encoded data, (ii) remove the second contribution of the inter-symbol-interference from the first subset of data, and (iii) add the first contribution of the inter-symbol-interference to the first subset of data; and a stitching unit configured to, subsequent to the recovery unit (i) removing the second segment of data (ii) removing the second contribution of the inter-symbol-interference and (iii) adding the first contribution of the inter-symbol-interference, stitch together the first segment of data and the third segment of data.

2. The disk drive controller of claim 1, further comprising:
an output unit configured to, subsequent to the stitching unit stitching together the first segment of data and the third segment of data, transmit the first segment of data and the third segment of data to a decoder.

3. The disk drive controller of claim 1, wherein the recovery unit is configured to refrain from (i) removing any contribution of inter-symbol-interference from the second subset of data, and (ii) adding any contribution of inter-symbol-interference to the second subset of data.

4. The disk drive controller of claim 1, wherein the second contribution of inter-symbol-interference is removed from the first subset of data according to the following equation:

$$y'_{L+i} + \underbrace{n^y_{L+i} + n^x_i}_{two-noise-terms} = y_{L+i} - \sum_{k=i}^{M} h_k \cdot a_{s-k+i} + x_i - \sum_{k=0}^{i-1} h_k \cdot a_{i-k}$$

for $1 \leq i \leq M$ wherein
y' is an ideal signal unaffected by the second contribution of inter-symbol-interference,
y is the ideal signal affected by the second contribution of inter-symbol-interference, $$\sum_{k=i}^{M} h_k \cdot a_{s-k+i} + x_i - \sum_{k=0}^{i-1} h_k \cdot a_{i-k}$$

represents the second contribution of inter-symbol-interference over the first subset of data, where the first subset of data comprises 'M' bits of data,
'h' represents a magnetic channel target response,
'a' represents data bits of the second segment of data, and
'x' represents the data bits of the second segment of data after convolution through the magnetic channel target response.

5. The disk drive controller of claim 1, wherein the encoded data is produced by a convolution of (i) channel bits and (ii) magnetic channel target response.

6. The disk drive controller of claim 1, wherein each of the first segment of data and the third segment of data comprises user data.

7. The disk drive controller of claim 1, wherein the second segment of data comprises non-user data.

8. The disk drive controller of claim 1, wherein the second segment of data comprises split mark data.

9. The disk drive controller of claim 1, wherein the second segment of data comprises servo data.

10. The disk drive controller of claim 1, wherein the second segment of data comprises syncmark data.

11. A method comprising:
receiving encoded data, wherein the encoded data comprises (i) a first segment of data, (ii) a second segment of data, and (iii) a third segment of data, wherein the first segment of data, the second segment of data and the third segment of data form consecutive segments of the encoded data, wherein the third segment of data comprises (i) a first subset of data and (ii) a second subset of data, wherein the first subset of data separates the second segment of data from the second subset of data, wherein the second segment of data is affected by a first contribution of inter-symbol interference due to the first segment of data, wherein the first subset of data is affected by a second contribution of inter-symbol interference due to the second segment of data, and wherein the second subset of data is unaffected by any contribution of inter-symbol interference due to the second segment of data identifying, in the encoded data, (i) the first segment of data, (ii) the second segment of data, and (iii) the first subset of data from the third segment of data;

removing the second segment of data from the encoded data;

removing the second contribution of the inter-symbol-interference from the first subset of data;

adding the first contribution of the inter-symbol-interference to the first subset of data; and subsequent to (i) removing the second segment of data, (ii) removing the second contribution of the inter-symbol-interference, and (iii) adding the first contribution of the inter-symbol-interference, stitching together the first segment of data and the third segment of data.

12. The method of claim 11, wherein the second contribution of inter-symbol-interference is removed from the first subset data of data according to the following equation:

$$y'_{L+i} + \underbrace{n^y_{L+i} + n^x_i}_{two-noise-terms} = y_{L+i} - \sum_{k=i}^{M} h_k \cdot a_{s-k+i} + x_i - \sum_{k=0}^{i-1} h_k \cdot a_{i-k}$$

for $1 \leq i \leq M$ wherein
y' is an ideal signal unaffected by the second contribution of inter-symbol-interference,
y is the ideal signal affected by the second contribution of inter-symbol-interference, $$\sum_{k=i}^{M} h_k \cdot a_{s-k+i} + x_i - \sum_{k=0}^{i-1} h_k \cdot a_{i-k}$$

represents the second contribution of inter-symbol-interference over the first subset of data, where the first subset of data comprises 'M' bits of data, 'h' represents a magnetic channel target response,
'a' represents data bits of the second segment of data, and
'x' represents data bits of the second segment of data after convolution through the magnetic channel target response.

13. The method of claim 11, further comprising:
refraining from (i) removing any contribution of inter-symbol-interference from the second subset of data, and (ii) adding any contribution of inter-symbol-interference to the second subset of data.

14. The method of claim 11, further comprising:
generating the encoded data by a convolution of (i) channel bits and (ii) magnetic channel target response.

15. The method of claim 11, further comprising:
subsequent to stitching together the first segment of data and the third segment of data, transmitting the first segment of data and the third segment of data to a decoder.

16. The method of claim 11, wherein each of the first segment of data and the third segment of data comprises user data.

17. The method of claim 11, wherein the second segment of data comprises non-user data.

18. The method of claim 11, wherein the second segment of data comprises split mark data.

19. The method of claim 11, wherein the second segment of data comprises servo data.

20. The method of claim 11, wherein the second segment of data comprises syncmark data.

* * * * *